United States Patent [19]
Shopbell

[11] Patent Number: 6,055,460
[45] Date of Patent: Apr. 25, 2000

[54] SEMICONDUCTOR PROCESS COMPENSATION UTILIZING NON-UNIFORM ION IMPLANTATION METHODOLOGY

[75] Inventor: Marlin L. Shopbell, Buda, Tex.

[73] Assignee: Advanced Micro Devices, Inc., Sunnyvale, Calif.

[21] Appl. No.: 08/907,310

[22] Filed: Aug. 6, 1997

[51] Int. Cl.[7] .............................. G06F 19/00; G06F 15/00
[52] U.S. Cl. ................................ 700/121; 700/97; 438/10
[58] Field of Search ............................... 438/5, 7, 10, 14, 438/51, 17; 700/121, 97, 98, 29–31; 395/500.22

[56] References Cited

U.S. PATENT DOCUMENTS

| | | | |
|---|---|---|---|
| 5,502,643 | 3/1996 | Fujinaga | 364/578 X |
| 5,621,652 | 4/1997 | Eakin | 364/578 X |
| 5,629,877 | 5/1997 | Tamegaya | 364/578 |
| 5,650,335 | 7/1997 | Terazono | 437/8 |
| 5,710,700 | 1/1998 | Kurtzberg et al. | 364/468.03 X |
| 5,737,250 | 4/1998 | Sawahata | 364/468.04 X |

FOREIGN PATENT DOCUMENTS

WO 88/10498   12/1998   WIPO .

OTHER PUBLICATIONS

04168763 Patent Abstracts of Japan for Japanese application No. 02296409 published Jun. 16, 1992.
07022601 Patent Abstracts of Japan for Japanese application No. 05151672 published Jan. 24, 1995.
01136331 Patent Abstracts of Japan for Japanese application No. 62295632 published May 29, 1989.
International Search Report for PCT/US98/12189 dated Oct. 7, 1998.

*Primary Examiner*—Paul P. Gordon
*Attorney, Agent, or Firm*—Kevin L. Daffer; Conley, Rose & Tayon

[57] ABSTRACT

The present invention proposes a method and apparatus for compensating for the spatial variation across the surface of a wafer in certain design parameters of semiconductor devices. The spatial variation in the design parameters is due to the spatial variation in some of the processes involved in the manufacturing of the devices upon the semiconductor wafer. Using metrology tools, the physical, chemical, and electrical parameters of the devices across the surface of the wafer are first measured and recorded. These device parameters include the certain design parameters that must remain within certain design limits or that are to be optimized. Examples of these design parameters for a transistor are the threshold voltage, the switching speed, and the current consumption. The spatial variation in the design parameters may be compensated by altering the doping profile across the wafer with some of the implantation steps. For example, heavier doping may be used for the source/drain regions of transistors close to the center of the wafer compared to doping for the source/drain regions which are close to the perimeter of the wafers. A computer model of the devices is used to determine the appropriate ion implantation profile for one or more implantation steps that would compensate for the spatial variation of the design parameters. Ion implantation is chosen for the compensation because the implantation dosage and energy can be accurately controlled, and because the ion implanters can be easily reprogrammed to deliver different amounts of dosages and energies in each region of the wafer. Small changes in the ion implantation doping profile are made for the next set of wafers and the device parameters along with the design parameters are remeasured.

19 Claims, 3 Drawing Sheets

SEMICONDUCTOR PROCESS COMPENSATION UTILIZING NON-UNIFORM ION IMPLANTATION METHODOLOGY

BACKGROUND OF THE INVENTION

1. Field of the Invention

This invention relates to the field of semiconductor processing and, more particularly, to a method and apparatus which compensates for spatial variations in semiconductor processes by using non-uniform ion implantation distribution profiles across the wafer surface.

2. Description of Relevant Art

The manufacturing of integrated circuits involves the physical and chemical processing of semiconductor wafers, typically silicon wafers. The processing of wafers can involve the introduction of external species (either by diffusion or implantation) into the substrate, patterning using photolithography techniques, removing material using wet or dry etching, polishing using mechanical and/or chemical means, chemical and/or physical vapor depositing or growing of films, as well as other physical and chemical processes.

Each wafer is subdivided into several sites, called die, their number depending on the size of each die and the size of the wafer. The different die or "chips" can be microprocessors, SRAMs, DRAMs, flash memories, and other forms of integrated circuits. In the past 25 years, the diameter of silicon wafers has steadily increased from less than 1 in to 8 in (200 mm) diameter wafers which are currently used by many semiconductor manufacturing companies.

Throughout the history of semiconductor wafer processing, a challenge has been to develop physical and chemical processes that produce uniform results across the entire surface of the wafer. The increasing wafer diameter has made the task of producing uniform results even more challenging. The silicon wafers themselves start out having spatial variations. Single-crystalline silicon is grown from melts of electronic grade poly-crystalline silicon ("EGS") containing minute quantities of impurities. EGS is produced by processing and purifying raw silicon. As the crystal is gradually pulled out of the melt, it grows, expands, and cools in a single ingot which has spatial variations in the dopant levels. These variations can be from end-to-end of the cylindrical ingot due to depletion of the dopant from the molten pool during the pull, and/or the variations can extend radially outward from the center of the cylindrical ingot. The ingot is then sliced into thin wafers which may exhibit chemical, mechanical, and electrical disparity from wafer to wafer and radially across each wafer.

Subsequent processing, like doping and etching, on ingot slices (or wafers) was initially performed on groups of wafers called wafer "runs". For example, for wet etching, a cassette containing several wafers would be submerged into an acid bath or for thermal annealing, a cassette containing several wafers would be introduced into large furnaces. In most cases of group processing, the wafers would exhibit variations in chemical, mechanical, and electrical parameters from wafer to wafer and across each wafer. As the diameter of the wafers increased, more processing tools were developed to process only single wafers at a time. Individual wafer processing reduced variations from wafer to wafer by varying processing parameters from one wafer to another to compensate for initial parameter variability. Process volume was reduced and each wafer experienced exactly the same gas flows, temperatures, etc. In large diffusion furnaces, there are temperature variations front-to-back and depletion effects front-to-back.

However, radial or cross-wafer variability (i.e., spatial variation) remained. With the reduction of critical dimensions into the submicron level, spatial uniformity of processes across each wafer became even more critical since devices made with submicron critical dimensions demonstrate reduced tolerance to process non-uniformity.

Initial circuit design assumes that semiconductor processes produce uniform results across the entire wafer topography. The design of an integrated circuit is optimized only if uniform mechanical, chemical, and electrical parameters exist across a wafer. These design parameters may be, for example, threshold voltage, breakdown voltage, current consumption, and switching speed. However, since most semiconductor processes produce non-uniform results across the wafer topography, some of the design parameters may be outside the acceptable design limits in certain portions of the wafer. For small spatial variations in the semiconductor processes, the design parameters may be outside the acceptable design limits but the devices may still function. As the variations grow though, the devices may not function at all. Yield losses which are a result of spatial variations in the manufacturing processes are a significant problem in integrated circuit manufacturing.

It would thus be desirable to have a method and equipment that can first accurately measure and determine spatial variations across the wafer due to the manufacturing processes. The method and equipment should then be able to compensate for these spatial variations. Such a method and equipment should result in design parameters which are within the acceptable design limits, or as close as possible to an optimum value, not only within a region of the wafer but across the entire wafer topography.

SUMMARY OF THE INVENTION

The present invention compensates for pre-existing spatial variation of certain design parameters by changing the doping profile of one or more ion implantation steps. First, using metrology tools, the physical, chemical, and electrical parameters of devices extending across the wafer are measured and recorded. The design parameters of the devices, the parameters that must remain within certain design limits, are noted. Due to the spatial variation in some of the semiconductor processes, some of the measured design parameters may be within acceptable design limits in some portions of the wafers but not in others. In that case, a computer model of the devices is used together with the recorded parameters to determine what should be the proper ion implantation gradient to apply in order to compensate for the recorded parameter gradient. The ion implantation doping profile gradient can be applied, for example, as a new source/drain doping profile gradient, as a new threshold voltage-adjust doping profile gradient, or as a channel-stop doping profile gradient. It could also be applied as a modified profile for a standard process implant. The ion implantation doping profiles are calculated and varied across the wafer in such a way as to ensure that all post-implant parameters are within acceptable design limits across the entire wafer surface.

Ion implantation is the preferred method for compensating for the spatial variation because of the ability to vary the ion implanter output across a wafer. Implantation energies can be increased or decreased by changing the voltage applied to the acceleration tube. As the scanner plates scan the ion beam across the wafer surface, a different energy may be selected at different scan positions to obtain a doping gradient at select depths across the wafer surface. Along with energy, the dosage of the implant may be controlled as a function of position to obtain a doping profile of dissimilar concentrations across the wafer surface. In addition, the timing sequence applied to the scanner may be changed to produce a non-linear pattern. Such a pattern allows the ion beam to spend more time in some portions of the wafer which results in higher doping concentration in those portions.

Broadly speaking, the present invention contemplates a method for compensating for spatial variations across a semiconductor wafer in measured parameters of devices formed upon and within the semiconductor wafer. A process is performed to form a device upon and/or within the semiconductor wafer. A plurality of parameters associated with the process is measured at a location of the semiconductor wafer. The plurality of parameters comprise a dopant concentration and a design parameter that must remain within design requirements. An ion implantation is then performed at the location. Settings for the ion implantation are determined using a computer model of the device. The settings are determined so that the design parameter is closer to the design requirements than a previous value of the parameter.

Performing a process preferably comprises performing ion implantations, performing depositions of films, performing patterning of materials, performing etching of materials, or performing thermal growth of films. The semiconductor wafer comprises an epitaxial layer of lightly-doped single-crystalline silicon.

Measuring a plurality of parameters preferably comprises measuring a plurality of physical, chemical and electrical parameters. Measuring a plurality of physical parameters comprises measuring a plurality of design dimensions of the devices. Measuring a plurality of chemical parameters comprises measuring doping profiles, and chemical compositions of materials. Measuring a plurality of electrical parameters comprises measuring sheet resistance of layers, measuring capacitance between design points, measuring threshold voltages, measuring operating voltages, measuring current consumption, delay time, response time, and break down parameters.

The design parameter preferably comprises threshold voltage, operating voltage, current consumption, and switching speed. Performing the ion implantation comprises implanting source/drain regions, performing threshold-adjust implants, implanting gate conductors, performing channel-stop implants, and performing well implants. The settings of the ion implanter preferably comprise timing sequences of the x-axis and y-axis. scanner plates, implantation energies as a function of x and y implantation coordinates, and implantation dosage as a function of the x and y implantation coordinates.

The present invention further contemplates a method for improving the yield of good dice upon a semiconductor wafer. A plurality of physical, chemical, and electrical parameters of devices formed on a wafer or wafers are measured and recorded according to their position upon the wafer. The physical, chemical, and electrical parameters are then analyzed to derive spatial distributions of those parameters which are position dependent.

A computer model is then used together with the spatial distributions of the physical, chemical, and electrical parameters to determine an ion implantation doping profile which will serve to shift or offset the measured parameters towards a desired optimum value within the design limits. "Offsetting" ion implanter controls are programmed to perform the "offsetting" ion implantation doping profile. The manufacturing process is then repeated for the next set of wafers using the new implantation profile. Adjustment could also be done on a wafer by wafer adjustment or for a set of wafers.

The manufacturing process includes ion implantations, depositions of thin films, etching of materials, and thermal growth of layers. Measuring a plurality of physical parameters comprises measuring a plurality of design dimensions of the devices. Measuring a plurality of chemical parameters comprises measuring doping concentrations, and chemical compositions of materials. Measuring a plurality of electrical parameters comprises measuring sheet resistance of layers, measuring capacitance between design points, measuring threshold voltages, measuring operating voltages, and measuring current consumption.

The parameters being measured may comprise threshold voltage, operating voltage, current consumption, and switching speed. The ion implantation doping profiles comprise the source/drain doping profiles, threshold-adjust doping, gate conductor doping, channel-stop doping, and well doping. The step of reprogramming a plurality of controls of an ion implanter comprises reprogramming the timing sequences of the x-axis and y-axis scanner plates, reprogramming of the implantation energy as a function of x and y implantation coordinates, and reprogramming of the implantation dosage as a function of the x and y implantation coordinates.

BRIEF DESCRIPTION OF THE DRAWINGS

Other objects and advantages of the invention will become apparent upon reading the following detailed description and upon reference to the accompanying drawings in which.

Figure 1:
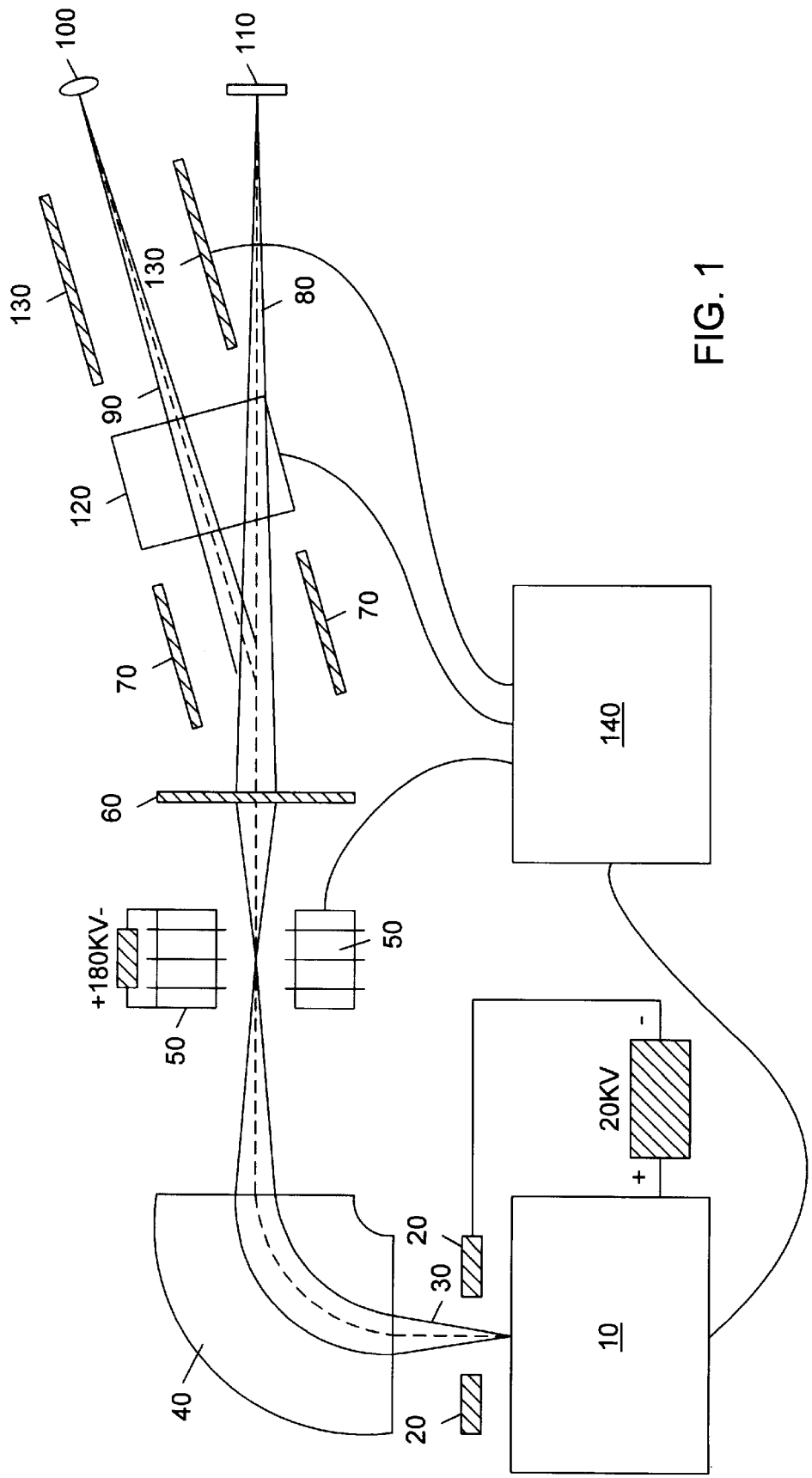
FIG. 1 is a schematic of an ion implanter, the output of which is selectively alterable to change physical, chemical, and electrical parameters formed upon and within FIG. 2 a flowchart describing the steps used to compensate for spatial variations of parameters formed according to a semiconductor manufacturing processes.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives failing within the spirit and scope of the present invention as defined by the appended claims.

DETAILED DESCRIPTION OF THE PREFERRED EMBODIMENTS

Given the physical and chemical limitations of many semiconductor processes used in the manufacturing of integrated circuits, it is not feasible to eliminate all factors that result in spatial variations across the wafer topography. Modern semiconductor metrology tools are able to accurately measure and characterize many parameters associated with the semiconductor devices across the wafer, including design parameters. Design parameters are parameters that must remain within certain design limits to ensure a certain performance and compatibility for the devices. Assuming that an accurate profile of all parameters can be measured and recorded relative to the position in which they are measured on the wafer, implant doping profiles can be derived to compensate for spatial variations of design parameters which fall outside a specific design limit. The new implant concentration profiles are calculated using a computer model of the devices together with the collected data on the device parameters.

Ion implantation has become the preferred technology for introducing dopants into target materials used in semiconductor processing. Ion implantation is a process in which energetic, charged atoms or molecules are accelerated by an implanter and then directed toward the semiconductor substrate. Acceleration energies can range from less than 10 keV to several MeV for high-energy implant systems.

FIG. 1 shows a schematic of an ion implanter. Ion source 10 ionizes the species to be implanted to form a plasma at low pressure, typically $10^{-3}$ torr. A voltage difference in the range of 15–40 kV is then applied between ion source 10 and plates 20 to extract and accelerate the ions which now form beam 30. Beam 30 is subsequently routed through analyzing device 40, typically a magnet, which spatially separates the beam according to the ionic mass of its constituents. The analyzer directs only ions with a specific mass toward the target while impurities with different ionic masses are disposed elsewhere.

Acceleration tube 50 creates an acceleration field to further increase the ion energy to the desired energy level. Tube 50 may also be used to decelerate the ions if the desired energy is less than the extracted energy. Focusing ring 60 is used to focus the beam into a ribbon or round shape depending on the application. Plates 70 are used to separate out any neutral components of the beam. As a result, neutral beam 80 is unaffected by plates 70 and is separated from ion beam 90 which is bent toward wafer target 100. Neutral beam 80 is stopped by target 1 10.

Scanner plates 120 (x-axis) and 130 (y-axis) are responsible for controlling the position of the ion beam over the surface of the wafer. By applying the appropriate timing control sequence to the plates, the whole wafer may be scanned by the ion beam. Initially, the timing control sequence applied to the plates is such to ensure uniform dopant distribution across the entire surface of the wafer.

Ion implantation has the ability to precisely control the number of implanted dopant atoms into substrates to within less than 1%. For dopant control in the $10^{14}$–$10^{18}$ atoms/cm$^3$ range, ion implantation is clearly superior to chemical deposition techniques and gas diffusion. Mass separation by the ion implanter ensures a very pure dopant. Because of the ion implantation's precise control over implantation energies, dosage, and position of implantation, ion implantation is the preferred method for correcting for spatial variations in other semiconductor processes.

Control unit 140 is responsible for programming and controlling the different settings for the ion implanter By controlling scanner plates 120 (axis) and 130 (y-axis) using control unit 140, the location where the ions are implanted into the wafer is precisely controlled. Furthermore, the amount of time that the ion beam spends at a particular location can also be accurately controlled. As the ion beam scans the wafer (or other target), the dose and energy can be varied as a function of location using the control unit. For example, a different value of the acceleration potential applied to acceleration tube 50 may be selected for each location of the ion beam. This will result in a non-uniform but well-controlled ion implantation profile across the surface of the wafer.

Ion implantation is used throughout the semiconductor manufacturing process. Low dose ($10^{11}$–$10^{12}$ ions/cm$^2$) ion implantation can be used to adjust the threshold voltage of transistors by implanting the channel region to change its doping concentration. Ions can be introduced into the semiconductor substrate to create the source and drain regions of transistors. The polysilicon gate structure of a transistor may also be doped to become conductive at the same time the source and the drain are doped. Ion implants can be used to increase the threshold voltage of parasitic transistors in order to minimize the probability of a turn-on of such a transistor. Heavy doping with an ion implanter can be used to alter the etch characteristics of materials for patterning.

In addition, ion implantation has many other advantages that make it ideal for compensating for other semiconductor processes. The dopant concentrations implanted using ion implantation can be predicted to within 10% for low energy implants and to within 2% for high energy implants. Being able to precisely predict the amount of doping that will result from specific settings of the ion implanter makes it possible for small corrections to be made. The implant may be performed through materials that may already be in place while other materials may be used as masks to create specific doping profiles. Furthermore, more than one type of dopant may be implanted at the same time and at the same position on the wafer. Other advantages include the fact that ion implantation may be performed at low temperature which does not harm photoresist and in high vacuum which ensures a clean environment.

Figure 2:
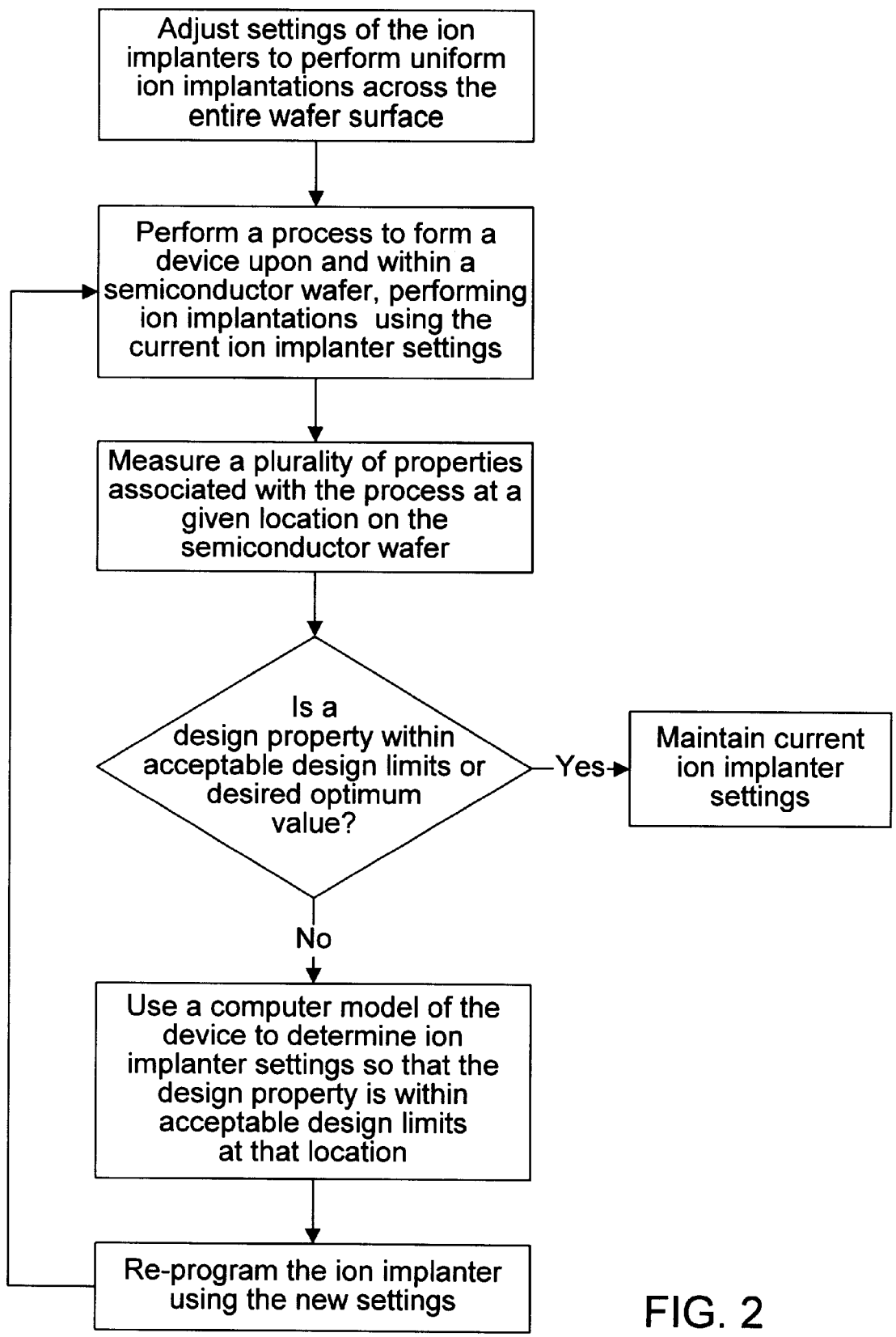

FIG. 2 shows a flow chart describing the proposed method to compensate for the spatial variation of semiconductor processes. The ion implantation equipment is initially set to produce uniform doping profiles across the surface of the wafer. The semiconductor manufacturing process then begins with these smooth doping profiles. All chemical, physical, and electrical parameters in relation to the semiconductor processes are measured using the appropriate metrology tool and then recorded. Each parameter is measured across the entire surface of the waver, and a spatial distribution across the surface is formed for each parameter.

Every device has certain design parameters that must remain within certain design limits to ensure a given performance and compatibility with other devices. A transistor's switching speed, threshold voltage, operating voltage, and current consumption in the different modes of operation are examples of such design parameters. The spatial distributions of these design limits are then studied to ensure that these parameters are within the design parameters across the entire wafer surface. Due to the spatial variation in certain semiconductor processes, some of the design parameters may be within acceptable design parameters in one portion of the wafer surface but not in another. For example, the dice in the center of the wafer may have a design parameter that meets the design requirements while the same parameter may be outside the design limits for dice close to the perimeter of the wafer.

In that case, all of the measured physical, chemical, and electrical parameters are inputted into a computer model of the particular device. The computer model then computes new non-uniform doping profiles to compensate for spatial variations caused by other processes. Any of the implant steps may be altered depending on which parameters need to be corrected. Examples of implant steps which may be altered include well implants, threshold adjust implants, source/drain implants, gate polysilicon implants, and channel-stop implants. In addition, it may be determined that a new implant step may be appropriate in some region of the wafer to correct for the spatial variations.

When the appropriate ion implant doping profile is determined, the ion implanter's controlling software is reprogrammed to the desired new dopant profile. The desired results may be accomplished by changing several different controls on the implanter. The scanning pattern, controlled by the x-axis and y-axis scanner plates, may be altered so that the implanter implants ions in certain areas of the wafer but not in others. By applying non-linear timing sequences to the x-axis and y-axis scanning plates, the amount of time that the ion beam spends at a particular area may be accurately controlled to provide a non-uniform profile. In systems with a stationary ion beam and a movable wafer stand, the motion pattern of the wafer stand may be reprogrammed.

The energy of the ion beam may be adjusted by controlling the voltage applied to the beam accelerator tube. A certain voltage may be applied, corresponding to each x and y coordinate of the beam, to obtain a profile of implantation depths across the surface of the wafer. Similarly, the dosage of the implant may be adjusted as a function of the x and y coordinate of the beam to obtain a profile of dopant concentration across the surface of the wafer. In all cases, small changes to the implantation profile are made each time. The design parameters are re-examined at the end of the next manufacturing sequence and, if needed, small changes are made again.

Figure 3:
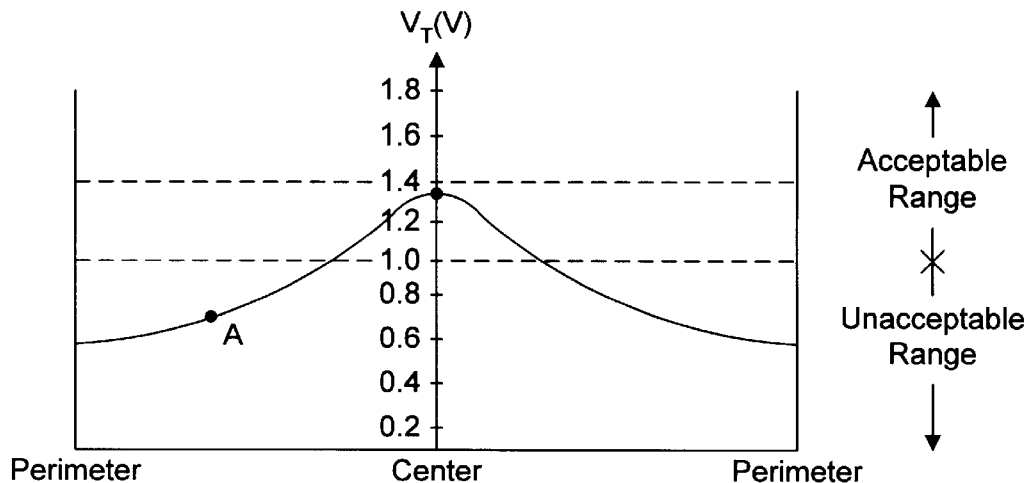
FIG. 3 is a graph showing the distribution of, e.g., threshold voltage measured at various religions across the wafer topography before compensation.

As an example of how the method may be applied, consider a wafer with NMOS-type transistors having a target threshold voltage of 1.2 V. NMOS-type transistors are metal-oxide-semiconductor transistors formed in a p-type substrate having a source and a drain region that are doped n-type. The channel of such a transistor, which is formed between the source and the drain, becomes n-type when a certain threshold voltage is applied to the gate of the transistor above the channel and the transistor turns on. Let us assume that, according to the design specifications, an acceptable range for the threshold voltage is 1.0–1.4 V. FIG. 3 shows a graph of the threshold voltage of the NMOS transistors across the wafer surface. The transistors in the center of the wafer are within the acceptable design specifications while the transistors close to the perimeter of the transistor are not. This may be due to radial spatial variations in several semiconductor processes. For example, location A has a threshold voltage value which is outside the acceptable design specifications.

Figure 4:
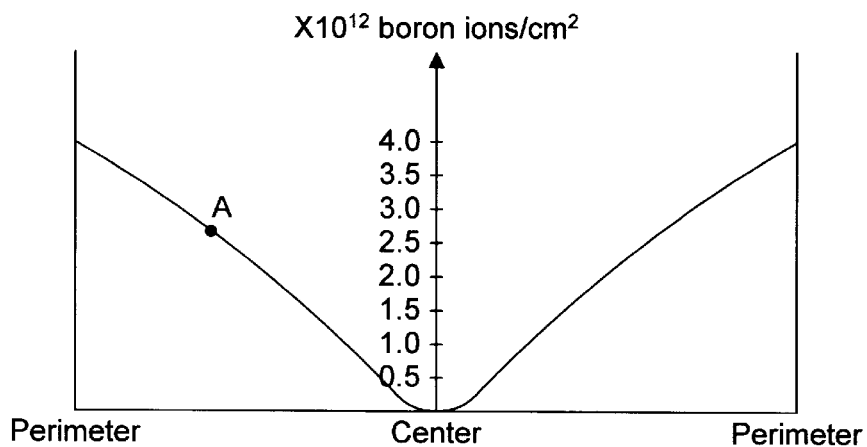
FIG. 4 is a graph showing the doping profile of a dopant implanted across the wafer topography to compensate for pre-existing spatial variation shown in FIG. 3.
Figure 5:
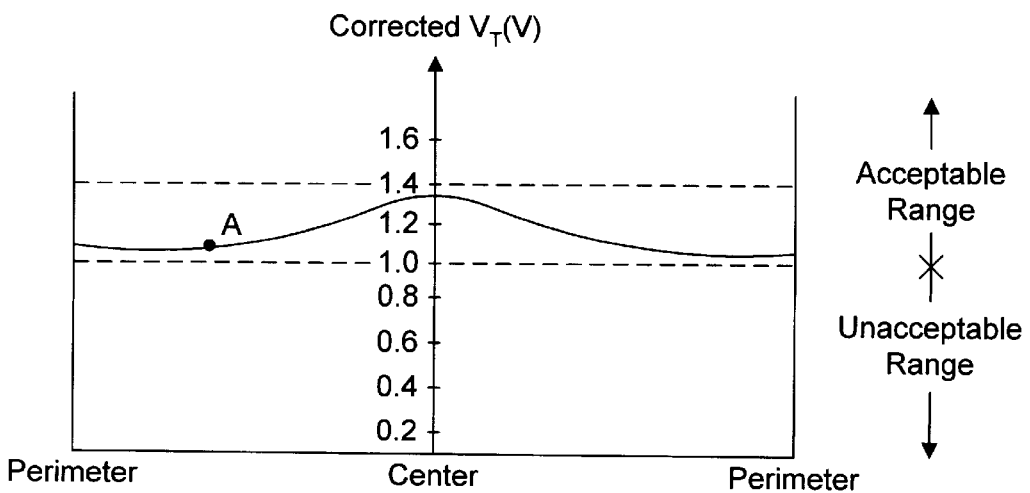
FIG. 5 is a graph showing the distribution of threshold voltage of transistors across the wafer topography after compensation.

One method of shifting the threshold voltage is to perform a threshold-adjust implant into the channel area of the transistor. Either a p-type or an n-type dopant may be introduced into the channel to respectively increase or decrease the existing background doping. In this example, boron may be introduced to increase the threshold voltage. The desired spatial doping profile of the boron is shown in FIG. 4. A higher concentration is chosen for the outer portion of the wafer where the required correction to the threshold is the largest while no implantation is performed close to center of the wafer where the threshold voltage is within the design limits. For example, a dose of approximately 2.2× $10^{12}$ ions/cm$^2$ is implanted at location A of FIG. 4. The corrected spatial distribution of the threshold voltage is shown in FIG. 5. The threshold voltage is now within the acceptable range across the entire wafer surface. The threshold voltage at location A of FIG. 5 is shown to now be approximately 1.05 V, which is now within the acceptable design specifications.

It will be appreciated to those skilled in the art having the benefit of this disclosure that this invention is believed to be capable of compensating for spatial variations in electrical, physical, and chemical parameters of semiconductor wafers. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A method for compensating for spatial variations in measured values of parameters of devices formed across a semiconductor wafer, said method comprising:

performing a plurality of process steps to form a device upon and within said semiconductor wafer;

measuring a plurality of parameter values associated with said process, wherein said measuring is performed at a location of said semiconductor wafer and further wherein said plurality of parameter values comprises a design parameter that must remain within design requirements; and performing an ion implantation at said location, wherein settings for said ion implantation are determined using a computer model of said device and wherein said settings are determined so that a value of said design parameter is closer to said design requirements than a value of said parameter prior to said performing said ion implantation.

2. The method as recited in claim 1, wherein said step of performing a plurality of process steps comprises performing ion implantations, performing depositions of films, performing patterning of materials, performing etching of materials, or performing thermal growth of films.

3. The method as recited in claim 1, wherein said step of measuring a plurality of parameter values comprises measuring a plurality of physical, chemical or electrical parameter values.

4. The method as recited in claim 3, wherein said step of measuring a plurality of physical parameter values comprises measuring critical dimensions or indices of refraction.

5. The method as recited in claim 3, wherein said step of measuring a plurality of chemical parameter values comprises measuring doping profiles or chemical compositions of materials.

6. The method as recited in claim 3, wherein said step of measuring a plurality of electrical parameter values comprises measuring sheet resistance of layers, capacitance between critical points, threshold voltages, operating voltages, current consumption, delay time, response time, or break down parameters.

7. The method as recited in claim 1, wherein said design parameter comprises threshold voltage, operating voltage, current consumption, switching speed, delay time, response time, or break down parameters.

8. The method as recited in claim 1, wherein the step of performing said ion implantation comprises implanting source/drain regions, performing threshold-adjust implants, implanting gate conductors, performing channel-stop implants, or performing well implants.

9. The method as recited in claim 1, wherein said settings of said ion implanter comprise timing sequences of the x-axis and y-axis scanner plates, implantation energies as a function of x and y implantation coordinates, and implantation dosage as a function of the x and y implantation coordinates.

10. The method of claim 1, wherein said performing an ion implantation comprises implantation at a location upon a different semiconductor wafer, wherein said location on said different semiconductor wafer is similar in position relative to said location upon said semiconductor wafer.

11. A method for compensating for a spatial variation across a semiconductor wafer in a measured parameter of a plurality of devices formed upon and within said semiconductor wafer, said method comprising:

performing a plurality of process steps to form said plurality of devices upon said semiconductor wafer;

measuring said parameter of each of said plurality of devices to determine a spatial distribution of said parameter across a surface of said semiconductor wafer; and performing an ion implantation across said surface of said semiconductor wafer, wherein settings for said ion implantation are determined using a computer model of said plurality of devices and wherein said settings vary according to an x coordinate and a y coordinate to reduce said spatial variation.

12. The method as recited in claim 11, wherein said step of measuring a plurality of parameters comprises measuring a plurality of physical, chemical or electrical parameters.

13. The method as recited in claim 12, wherein said step of measuring a plurality of physical parameters comprises measuring critical dimensions, or indices of refraction.

14. The method as recited in claim 12, wherein said step of measuring a plurality of chemical parameters comprises measuring doping profiles, or chemical compositions of materials.

15. The method as recited in claim 12, wherein said step of measuring a plurality of electrical parameters comprises measuring sheet resistance of layers, capacitance between critical points, threshold voltages, operating voltages, current consumption, delay time, response time, or break down parameters.

16. The method as recited in claim 11, wherein the step of performing said ion implantation comprises implanting source/drain regions, performing threshold-adjust implants, implanting gate conductors, performing channel-stop implants, or performing well implants.

17. The method as recited in claim 11, wherein said settings of said ion implanter comprise timing sequences of the x-axis and y-axis scanner plates, implantation energies as a function of x and y implantation coordinates, and implantation dosage as a function of the x and y implantation coordinates.

18. The method as recited in claim 11, wherein said step of performing a plurality of process steps comprises performing ion implantations, performing depositions of films, performing patterning of materials, performing etching of materials, or performing thermal growth of films.

19. The method of claim 11, wherein said performing an ion implantation comprises implanting across a surface of another semiconductor wafer, separate from said semiconductor wafer.

* * * * *